(12) United States Patent
Nishi et al.

(10) Patent No.: US 8,053,495 B2
(45) Date of Patent: Nov. 8, 2011

(54) CERAMIC POWDER AND APPLICATIONS THEREOF

(75) Inventors: Yasuhisa Nishi, Omuta (JP); Mitsuyoshi Iwasa, Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 24 days.

(21) Appl. No.: 12/300,516

(22) PCT Filed: May 11, 2007

(86) PCT No.: PCT/JP2007/059746

§ 371 (c)(1),
(2), (4) Date: Mar. 30, 2009

(87) PCT Pub. No.: WO2007/132771

PCT Pub. Date: Nov. 22, 2007

(65) Prior Publication Data

US 2009/0312477 A1    Dec. 17, 2009

(30) Foreign Application Priority Data

May 12, 2006   (JP) ................................. 2006-133464

(51) Int. Cl.
*C08K 7/00* (2006.01)
(52) U.S. Cl. ........ 523/220; 106/482; 423/335; 524/492; 524/493
(58) Field of Classification Search .................. 523/220; 106/482; 423/335; 524/492, 493
See application file for complete search history.

(56) References Cited

U.S. PATENT DOCUMENTS 6,365,269 B1   4/2002   Atzesdorfer et al.

FOREIGN PATENT DOCUMENTS

| CN | 1288914 A | * | 3/2001 |
|---|---|---|---|
| JP | 3 66151 | | 3/1991 |
| JP | 6 80863 | | 3/1994 |
| JP | 8 3365 | | 1/1996 |
| JP | 2001 158614 | | 6/2001 |
| JP | 2002 252314 | | 9/2002 |
| JP | 2003-110065 | | 4/2003 |
| JP | 2004 59343 | | 2/2004 |
| JP | 2005 306923 | | 11/2005 |
| WO | WO 2005/061615 A1 | | 7/2005 |
| WO | WO 2006/011662 A1 | | 2/2006 |

OTHER PUBLICATIONS

U.S. Appl. No. 12/300,528, filed Nov. 12, 2008, Nishi, et al.

* cited by examiner

*Primary Examiner* — Edward J Cain
(74) *Attorney, Agent, or Firm* — Oblon, Spivak, McClelland, Maier & Neustadt, L.L.P.

(57) ABSTRACT

The present invention provides ceramic powder capable of being incorporated into rubber or a resin for the preparation of a composition, which shows excellent heat resistance and flame retardancy and which is used, for instance, as a semiconductor-sealing material. The ceramic powder has a multi-peak frequency distribution pattern having at least two peaks as a particle size distribution as determined using a laser diffraction-scattering type particle size-analyzer, wherein the maximum particle size for the first peak ranges from 40 to 80 μm and that for the second peak ranges from 3 to 8 μm and wherein the rate of the particles having a particle size of not less than 20 μm and less than 40 μm is not more than 20% by mass (inclusive of 0% by mass).

20 Claims, No Drawings

CERAMIC POWDER AND APPLICATIONS THEREOF

CROSS REFERENCE TO RELATED APPLICATION

This application is a 371 of PCT/JP07/059,746, filed on May 11, 2007, and claims priority to Japanese Patent Application No. 2006-133464, filed on May 12, 2006.

TECHNICAL FIELD

The present invention relates to ceramic powder and the applications thereof.

BACKGROUND ART

The miniaturization, thinning or slimming, and pitch-reduction of semiconductor packages have rapidly been accelerated, in response to the recent requirements for the development of compact and light weight, and high quality electronic machinery and tools. In addition, the surface mounting technique has been a leading mainstream of the packaging method because this is quite favorable for realizing high density packaging of a wiring board or substrate. As the semiconductor packages and the methods for packaging the same have thus been advanced, there have been requested for the semiconductor-sealing material to satisfy the requirements for the improvement of functions thereof such as the quality, in particular, moldability, heat resistance, and flame-retardancy. For this reason, for instance, investigation has been made concerning incorporation of ceramic powder, in particular, amorphous spherical silica powder into epoxy resin in a high density. The problems arising when incorporating ceramic powder into a resin at a high density (or high content) are those that the viscosity of the resulting semiconductor-sealing material increases and that this in turn increases the rate of defectives to be formed during the molding and processing of the semiconductor devices such as the generation of unfilled portions, the occurrence of wire-flowing, wire-cutting and chip-shifting.

To solve the foregoing problems, the semiconductor-sealing materials have been improved from the viewpoint of resins on the one hand and from the viewpoint of the ceramic powder on the other hand.

As means for the improvement of the ceramic powder, there have been known, for instance, a method for increasing the Wardell to a level ranging from 0.7 to 1.0 (see Patent Document 1 specified below); a method in which the gradient of the straight line illustrating the particle size distribution expressed in terms of the Rosin-Rammler line diagram is set at a level of 0.6 to 0.95 to thus expand the particle size distribution (see Patent Document 2 specified below); and a method in which the ceramic powder is so designed that the particle size thereof has a multi-peak particle size distribution or that the particle size distribution thereof may have several peaks to thus bring the ceramic powder close to that having the closest packing structure (see Patent Document 3 specified below). However, these conventional methods have still been insufficient. More specifically, there has not yet been solved such a problem that when increasing the rate of incorporation of ceramic powder into a resin, the resulting semiconductor-sealing material causes an abrupt increase of the viscosity thereof.

Recently, electronic machinery and tools have widely been applied to automobiles and therefore, it has been requested for these electronic machinery and tools to satisfy the following requirements: they should have an improved flame-retardancy without using any flame retarder which may apply a high load to the environment; they should have an improved ability to withstand high temperature environmental conditions severer than that required for the household machinery and tools (heat resistance); and it should have an improved ability to withstand the cooling-heating cycles (thermal shocks). However, there has not yet been developed any such ceramic powder which can satisfy all of the foregoing requirements.

Patent Document 1: JP-A-3-066151;
Patent Document 2: JP-A-6-080863;
Patent Document 3: JP-A-8-003365

DISCLOSURE OF THE INVENTION

Problem to be Solved by the Invention

Accordingly, it is an object of the present invention to provide ceramic powder which permits the preparation of a semiconductor-sealing material having excellent moldability even when increasing the rate of content of the ceramic powder in a resin, and also having excellent heat resistance and flame-retardancy; a composition and, in particular, a semiconductor-sealing material, which comprises at least one of a resin and rubber and the foregoing ceramic powder incorporated into the same.

Means for Solving the Problem

The present invention thus provides ceramic powder characterized by having a multi-peak frequency distribution pattern having at least two peaks as a particle size distribution determined using a laser diffraction-scattering type particle size-analyzer, the maximum particle size for the first peak ranging from 40 to 80 μm and that for the second peak ranging from 3 to 8 μm, and the rate of the particles having a particle size of not less than 20 μm and less than 40 μm being not more than 20% by mass (inclusive of 0% by mass).

In this respect, the present invention preferably comprises at least one embodiment selected from the groups consisting of 1) the ceramic powder further has a third peak whose maximum particle size ranges from 0.1 to 0.8 μm; 2) the ceramic powder has an ammonia adsorption amount ranging from 0.1 to 1.8 μmole/g; 3) the ceramic powder is silica powder; 4) the ceramic powder is silica powder and having an $Al_2O_3$ content ranging from 100 to 8000 ppm.

In addition, the present invention also provides a composition comprising at least one of a resin and rubber and the ceramic powder of the present invention incorporated into the same. Furthermore, the present invention also relates to a semiconductor-sealing material comprising the composition of the present invention wherein the composition comprises an epoxy resin.

Effects of the Invention

The present invention can provide a resin composition or a rubber composition (hereunder both of them will comprehensively be referred to as "composition") and, in particular, a semiconductor-sealing material, which can maintain its higher moldability and which is excellent in a heat resistance and a flame retardancy, even if the rate of incorporation of the ceramic powder in the resin or rubber composition is increased up to a level of not less than 90% by mass.

Best Mode for Carrying Out the Invention

The present invention will hereunder be described in more detail.

The powder according to the present invention comprises ceramic powder and example of ceramic powder includes powder of, for instance, silica, alumina, titania, magnesia, silicon nitride, aluminum nitride and boron nitride.

These powdery products may be used alone or a mixture of at least two powdery products, but preferably used herein is silica powder since the use thereof permits the preparation of a semiconductor-sealing material having a thermal expansion coefficient close to that of a semiconductor element, and the silica powder can further improve the heat resistance, the resistance to thermal shocks (cooling-heating cycles) and the mold wear-resistant properties. In this respect, particularly preferably used herein are, for instance, amorphous silica prepared by melting crystalline silica at a high temperature, and amorphous silica prepared according to any synthetic method. The rate of amorphousness of the amorphous silica powder is preferably not less than 95% as determined according to the method as will be detailed later.

The ceramic powder according to the present invention is characterized by having a multi-peak frequency distribution pattern having at least two peaks as a particle size distribution determined using a laser diffraction-scattering type particle size-analyzer, the maximum particle size for the first peak ranging from 40 to 80 μm and that for the second peak ranging from 3 to 8 μm, and the rate of the particles having a particle size of not less than 20 μm and less than 40 μm being not more than 20% by mass (inclusive of 0% by mass). The impartment of these characteristic properties to the ceramic powder would permit the preparation of a semiconductor-sealing material which can maintain its higher moldability and which is also excellent in a heat resistance and a flame retardancy, even if the rate of incorporation of the ceramic powder in an epoxy resin or the like is increased up to a level of not less than 90% by mass. In this connection, in the ceramic powder having a multi-peak particle size distribution as disclosed in Patent Document 3, the rate of the ceramic particles occupied by those having a particle size ranging from 20 to 40 μm falls within the range of from about 40 to 52% by mass.

A group of particles constituting the first peak whose maximum particle size ranges from 40 to 80 μm are principal constituent particles of the ceramic powder according to the present invention, but if the maximum particle size thereof is less than 40 μm, the ceramic powder causes an abrupt increase of the viscosity thereof and this in turn makes, quite difficult, the preparation of an intended composition having high moldability. On the other hand, if the maximum particle size thereof exceeds 80 μm, the flow resistance of the particles in the resulting composition increases and the moldability of the composition is likewise impaired. The maximum particle size of the first peak preferably ranges from 50 to 70 μm. In this respect, the content of the particles whose particle size falls within the range of from 40 to 80 μm is preferably not less than 40% by mass and in particular, the content thereof is preferably not less than 45% by mass. Suitably, the upper limit thereof is, for instance, 70% by mass.

A group of particles constituting the second peak whose maximum particle size ranges from 3 to 8 μm enter into interstices present in the group of particles constituting the first peak to thus make the packing structure of the particles denser and as a result, the presence of such particles constituting the second peak would permit the further improvement of the packing characteristics of the ceramic powder and the further reduction of the viscosity of the resulting composition. The maximum particle size thereof preferably ranges from 4 to 7 μm. In particular, if the maximum particle size of the particles constituting the second peak is so adjusted that it is 0.1 to 0.2 times the maximum particle size of the particles constituting the first peak, the resulting ceramic powder is further improved in the packing characteristics. In this respect, however, the content of the particles whose particle size falls within the range of from 3 to 8 μm is preferably not less than 20% by mass and in particular, the content of such particles is preferably not less than 30% by mass. Suitably, the upper limit thereof is, for instance, 60% by mass.

A group of particles constituting the third peak whose maximum particle size ranges from 0.1 to 0.8 μm which may arbitrarily be used in the present invention enter into interstices of the packing structure formed by the particles constituting the first and second peaks to thus make the packing structure of the particles denser. As a result, the presence of such particles constituting the third peak would permit the maintenance of the excellent moldability even when the rate of incorporation of the ceramic powder is increased in the resulting composition and accordingly, the use of the particles constituting the third peak would permit the preparation of a composition having further excellent heat resistance and flame retardancy. In this connection, the content of the particles having a particle size ranging from 0.1 to 0.8 μm is preferably not less than 3% by mass and in particular, it is preferably not less than 10% by mass. Suitably, the upper limit thereof is, for instance, 25% by mass.

In the present invention, the particles whose particle size is not less than 20 μm and less than 40 μm are not necessary for the dense packing structure constituted by the particles constituting the foregoing two or three peaks and therefore, it is most preferable that the ceramic powder is free of (0%) any such particle and the content thereof is at highest 20% by mass (inclusive of 0%) and it is suitable that the content thereof is preferably at highest 10% by mass (inclusive of 0%). This condition is quite important and there has not yet been proposed any ceramic powder in which the content of the particles whose particle size is not less than 20 μm and less than 40 μm is strictly controlled.

It is common that a curing accelerator is incorporated into the semiconductor-sealing material for the purpose of the acceleration of the reaction between an epoxy resin and a curing agent. Examples of such curing accelerators are organic phosphorus atom-containing ones such as tributyl phosphine, methyl-dimethyl phosphine, triphenyl phosphine, tris(4-methylphenyl) phosphine, diphenyl phosphine, phenyl phosphine, tetraphenyl phosphine tetraphenyl borate, and triphenyl phosphine tetraphenyl borate; and organic nitrogen atom-containing ones represented by cycloamidine compounds such as 1,8-diaza-bicyclo(5,4,0) undecene-7, 1,5-diaza-bicyclo(4,3,0) nonene, and 5,6-di-butylamino-1,8-diaza-bicyclo(5,4,0) undecene-7. In general, the rate of addition of these curing accelerators to the composition is selected in such a manner that it falls within the range of from 0.1 to 5% by mass depending on the desired curing rate of each specific composition. However, all of these curing accelerators show strong characteristics as a Lewis acid and accordingly, they may impair the ability of the resulting semiconductor-sealing material to withstand high temperature environmental conditions (heat resistance).

For this reason, the ceramic powder according to the present invention should preferably have a chemical absorption amount of ammonia ranging from 0.1 to 1.8 μmole/g. More preferably, the absorption amount of ammonia adsorbed by the ceramic powder ranges from 0.1 to 1.6 μmole/g and in particular, it preferably ranges from 0.2 to 1.4 μmole/g. The level of the ammonia amount chemically adsorbed represents the magnitude of the surface acidity of the ceramic powder. The control of the surface acidity of the ceramic powder would permit the achievement of stable curing characteristics of the resulting composition simultaneous with the achievement of the ability thereof to withstand high temperature environmental conditions. In this respect, if a chemical absorption amount of ammonia is less than 0.1 μmole/g, the curing accelerator is not easily trapped at the acidic sites on the surface of the ceramic powder and this may in turn result in the deterioration of the ability of the resulting composition to withstand high temperature environmental conditions (heat resistance). On the other hand, if the amount of chemically adsorbed ammonia exceeds 1.8 μmole/g, the curing accelerator is trapped at the acidic sites on the surface of the ceramic powder to an extremely high extent and this accordingly reduces the curing rate of the resulting composition and as a result, any desired cured composition cannot be obtained even after the molding of the composition.

In case where the ceramic powder is, in particular, silica powder, the amount of chemically ammonia adsorption can be controlled through the adjustment of the content of $Al_2O_3$ present in the silica powder. More specifically, when the surface of the silica powder is doped with Al atoms, the sites doped with Al atoms may serve as Lewis acidic sites due to the difference in the coordination number between Si atom and Al atom. The amount of chemically ammonia adsorption can easily be controlled to a desired level ranging from 0.1 to 1.8 μmole/g by adjusting the content of $Al_2O_3$ present in the silica powder to a level ranging from 100 to 8000 ppm.

The average degree of sphericity of the ceramic powder of the present invention is preferably not less than 0.85 and in particular, not less than 0.90. The maximum level thereof is preferably 1.00. The control of the sphericity of the ceramic powder would permit the further reduction of the viscosity of the resulting composition.

The particle size distribution of the ceramic powder according to the present invention is one determined on the basis of the particle size measurement carried out according to the laser diffraction-scattering technique. The particle size distribution-analyzer usable herein is, for instance, "Model LS-230" (the particle size channel has a width: log(μm) =0.04) available from Beckman Coulter Company. Upon the determination of the particle size, water is used as a solvent and each sample is subjected to a dispersion treatment, as a pre-treatment, for one minute using a homogenizer while applying a power of 200 W. In addition, PIDS (Polarization Intensity Differential Scattering) concentration is adjusted to a level ranging from 45 to 55% by mass. The refractive index of water is assumed to be 1.33, while taking into consideration the refractive index of the material for the sample powder with regard to that of the sample powder. For instance, the refractive index of amorphous silica is assumed to be 1.50.

The term "maximum particle size" used herein means the central value (median) for the particle size range showing a maximum value in the frequency particle size distribution as determined according to the laser diffraction-scattering technique. For instance, when, in the cumulative particle size distribution, the cumulative value up to the particle size of 32 μm is 50% by mass, that up to the particle size of 48 μm is 65% by mass and that up to the particle size of 64 μm is 70% by mass, the maximum particle size within the particle size range showing a maximum value and extending from 32 to 48 μm can be calculated to be 40 μm which is the central value of the foregoing particle size range (32 to 48 μm).

The amount of the ammonia adsorption is determined as follows, using a temperature raising thermal desorption-mass spectroscopic analysis device: TPD-MS (for instance, a device available from ANELVA Corporation under the trade name of "Model M-400"): (Pretreatment): About 0.1 g of sample powder is precisely measured into a platinum dish, then the temperature of the sample powder is raised from room temperature to 600° C. over 30 minutes in a tubular furnace, while flowing helium gas through the furnace at a flow rate of 40 ml/min, the sample powder is then maintained in the furnace for 10 minutes at that temperature and the temperature of the sample powder is reduced to 100° C. (Ammonia-Adsorption): The furnace is evacuated to vacuum while maintaining the temperature of the sample powder at 100° C., about 13 kPa of ammonia gas is introduced into the tubular furnace to thus adsorb ammonia on the sample powder over 15 minutes. After the tubular furnace is evacuated to vacuum, helium gas is passed through the furnace at a flow rate of 50 ml/min for 15 minutes to thus purge the residual ammonia from the furnace and then the temperature of the sample is reduced to room temperature. (Water-Treatment): Argon gas is bubbled through pure water at a flow rate of 10 ml/min, argon gas is blended with the resulting humidified gas at a flow rate of 40 ml/min to thus obtain an inert gas having a relative humidity of 20% and the foregoing sample powder is exposed to this gas flow over one hour to thus replace the adsorbed ammonia with water. (Determination of Amount of Adsorbed Ammonia): The temperature of the sample powder is raised from room temperature to 1000° C. at a rate of temperature raise of 20° C./min, while flowing helium gas at a flow rate of 40 ml/min, to thus determine the amount of the desorbed ammonia. In this connection, the quantitative analysis of ammonia adsorbed was carried out using the pattern of m/z=17 obtained after making correction for the influence of water.

The rate of amorphousness is determined by subjecting each sample powder to the X-ray diffraction analysis within the range of 2 θ for the CuK α-rays extending from 26° to 27.5° using a powder X-ray diffraction device (such as a device available from RIGAKU Co., Ltd. under the trade name of "Model Mini Flex") and calculating the rate on the basis of the intensity ratio of characteristic diffraction peaks. For instance, in case of the silica powder, the crystalline silica shows a principal peak at 26.7° while the amorphous silica is free of such a peak. If both crystalline silica and amorphous silica are present in a sample, the height of the peak observed at 26.7° would reflect the rate of the crystalline silica present therein, the rate of the crystalline silica mixed in the sample powder [(X-ray diffraction intensity of sample)/(X-ray diffraction intensity of crystalline silica)] can be calculated from the ratio of the intensity of X-ray observed for the standard or reference sample of crystalline silica to that observed for each sample powder and the rate of amorphousness can therefore be determined according to the following relation: Rate of Amorphousness (%)=[1−(rate of crystalline silica mixed in)]×100.

The $Al_2O_3$ content may be determined using, for instance, a fluorescent X-ray analysis device (XRF), an energy dispersive X-ray spectroscopy device (EDX), an atomic absorption spectrometer (AAS), or a plasma emission spectral analyzer (ICP). In the present invention, ceramic powder was dissolved, with heating, in a 20:1 (volume ratio) hydrogen fluoride: perchloric acid mixed solvent followed by the dilution thereof with pure water, the determination of the Al content using an atomic absorption spectrometer available from Shimadzu Corporation and the conversion of the Al content into the $Al_2O_3$ content to thus determine the desired $Al_2O_3$ content.

The average sphericity is determined by taking a particle image using a stereomicroscope (such as one available from Nikon Corporation under the trade name of "Model SMZ-10 Type"), incorporating the particle image into an image analyzer (such as a device available from Mountech Company under the trade name of "MacView") and determining the projected area (A) and the peripheral length (PM) on the basis of the photograph to thus determine the average sphericity on the basis of these two data. In this respect, if the area of a true circle corresponding to the peripheral length (PM) thus determined is assumed to be (B), the circularity of the particle is equal to A/B. Accordingly, if bearing in mind a true circle having a peripheral length identical to that (PM) of the sample, the following relation holds: $B=\pi \times (PM/2\pi)^2$, since $PM=2\pi r$ and $B=\pi r^2$, and accordingly, the circularity of each particle can be represented by the following relation: Circularity=A/B=A×4 $\pi/(PM)^2$. The circularity was determined for arbitrarily selected 200 particles according to the foregoing procedures and the resulting average value is squared and this is deemed to be an intended average sphericity.

The ceramic powder according to the present invention can easily be prepared by blending, as arbitrary components, particles having an average particle size ranging from 0.1 to 0.8 μm, those having an average particle size ranging from 3 to 8 μm and those having an average particle size ranging from 40 to 80 μm. Moreover, when the ceramic powder is powder of a spherical oxide such as spherical silica powder, the desired ceramic powder can be prepared according to a method comprising the steps of injecting raw powder into a flame having a high temperature to thus melt and sphere the raw powder and subsequently recovering the resulting spherical powder using a collecting machine such as a gravitational sedimentation chamber, a cyclone, bag filter, or an electrostatic precipitator, wherein processing conditions such as the particle size of the starting powder, the amount thereof to be injected and the temperature of the flame are appropriately changed, or the recovered powder is subjected to an operation such as classification, sieving or blending, or the recovered powder is subjected to a combination of the foregoing two kinds of treatments. The $Al_2O_3$ content can be controlled by, for instance, coating the surface of starting silica powder with alumina particles having a particle size ranging from about 0.1 to 5 μm in an amount ranging from about 0.01 to 2% by mass and then treating the coated powder with a flame to thus melt and sphere the coated powder. The raw powder can be coated with alumina particles using a commercially available coating device or a blender.

The composition of the present invention is one obtained by incorporating the ceramic powder according to the present invention into at least one of a resin and rubber. The content of the ceramic powder to be incorporated into the composition in general ranges from 10 to 99% by mass and more preferably 30 to 95% by mass.

Examples of such resins usable herein include epoxy resins, silicone resins, phenol resins, melamine resins, urea resins, unsaturated polyesters, fluorine resins, polyamides such as polyimides, poly(amide-imides), and polyetherimides, polyesters such as polybutylene terephthalate and polyethylene terephthalate, polyphenylene sulfides, wholly aromatic polyesters, polysulfones, liquid crystalline polymers, polyether sulfones, polycarbonates, maleimide-modified resins, ABS resins, AAS (acrylonitrile-acryl rubber/styrene) resins, and AES (acrylonitrile/ethylene/propylene/diene rubber-styrene) resins.

Among them, preferably used in a semiconductor-sealing material are epoxy resins each having at least two epoxy groups per molecule. Examples thereof are phenol novolak type epoxy resins, o-cresol novolac type epoxy resins, epoxy resins obtained by epoxy-modifying novolak resins of phenols with aldehydes, glycidylethers such as bisphenol A, bisphenol and bisphenol S, glycidyl ester acid epoxy resins prepared through the reactions of polybasic acids such as phthalic acid and dimeric acids with epichlorhydrin, linear aliphatic epoxy resins, alicyclic epoxy resins, heterocyclic epoxy resins, alkyl-modified polyfunctional epoxy resins, β-naphthol novolac type epoxy resins, 1,6-dihydroxynaphthalene type epoxy resins, 2,7-dihydroxynaphthalene type epoxy resins, and bishydroxy-biphenyl type epoxy resins, as well as epoxy resins in which a halogen such as bromine is incorporated in order to impart flame retardancy to the composition. Among them, suitably used herein include o-cresol novolak type epoxy resins, bishydroxy-biphenyl type epoxy resins and epoxy resins carrying naphthalene skeletons, from the viewpoint of water vapor resistance and resistance to solder reflow.

As curing agents for the epoxy resins, there may be listed, for instance, novolak resins prepared by reacting a mixture comprising one or at least two members selected from the group consisting of phenol, cresol, xylenol, resorcinol, chlorophenol, t-butylphenol, nonylphenol, isopropylphenol, and octylphenol with formaldehyde, paraformaldehyde or p-xylene in the presence of an oxidizing catalyst, poly(p-hydroxystyrene) resins, bisphenol compounds such as bisphenol A and bisphenol S, tri-functional phenols such as pyrogallol and fluoroglucinol, acid anhydrides such as maleic anhydride, phthalic anhydride and pyromellitic anhydride, and aromatic amines such as m-phenylene diamine, diamino-diphenyl-methane and diamino-diphenyl sulfone. A curing accelerator such as the aforementioned triphenyl-phosphine and 1,8-diaza-bicyclo(5,4,0)undecene-7 can be used for the acceleration of the reaction of epoxy resins with curing agents.

The following components may, if necessary, be incorporated into the composition of the present invention. More specifically, examples of such optional components include a stress-reducing agent, for instance, rubber-like materials such as silicone rubber, polysulfide rubber, acrylic rubber, butadiene-derived rubber, styrene-derived block copolymers, various kinds of thermoplastic resins, resinous materials such as silicone resins, epoxy resins, phenol resins which are partially or completely modified with, for instance, amino-silicone, epoxy-silicone, and alkoxy-silicone; a silane coupling agent, for instance, epoxy-silanes such as γ-glycidoxy-propyl trimethoxy-silane, and β-(3,4-epoxy-cyclohexyl)ethyl-trimethoxy-silane, amino-silanes such as aminopropyl-triethoxy-silane, ureido-propyl triethoxy-silane, and N-phenyl-aminopropyl trimethoxy-silane, a hydrophobic silane compound such as phenyl trimethoxy-silane, methyl trimethoxy-silane and octadecyl trimethoxy-silane, and mercapto-silane; a surface-treating agent such as Zr-chelate, titanium-coupling agents and aluminum-coupling agent; a flame retardant aid such as $Sb_2O_3$, $Sb_2O_4$ and $Sb_2O_5$; a flame retardant such as halogenated epoxy resins and phosphorus atom-containing compounds; a coloring agent such as carbon black, iron oxides, dyes and pigments; and further a releasing agent such as naturally occurring waxes, synthetic waxes, metal salts of linear fatty acids, acid amides, esters and paraffin.

The composition of the present invention can be prepared by blending desired amounts of the foregoing components in, for instance, a blender or a Henschel mixer, then kneading the resulting blend using a heating rolls, a kneader, a single-screw or twin-screw extruder, cooling and then pulverizing the same.

The semiconductor-sealing material according to the present invention is preferably the composition of the present invention which comprises an epoxy resin. When a semiconductor is sealed using the semiconductor-sealing material according to the present invention, widely and commonly used molding means such as a transfer mold or a multi-plunger press can be used.

EXAMPLE

Examples 1 to 5 and Comparative Examples 1 to 5

A pulverized product of natural quartzite was melted and sphered by supplying the product to a flame formed through the combustion of a mixture containing LPG and oxygen gas to thus form spherical amorphous silica powder. In this respect, 10 kinds of spherical amorphous silica powder samples A to as shown in the following Table 1 were prepared, while variously adjusting the flame-forming conditions, the particle size of the raw material, the feed rate of the raw material, the classification conditions and the mixing conditions. The maximum particle size and the content of particles having a particle size of not less than 20 μm and less than 40 μm were controlled by appropriately adjusting or changing the particle size of the starting material, the conditions for multi-stage sieving of the sphered powder and the blending amounts of the crude particles, fine particles, ultrafine particles recovered through the sieving operations. The content of $Al_2O_3$ was controlled by coating the surface of the pulverized product of natural quartzite with ultrafine particles of alumina having a particle size of 0.5 μm in an amount ranging from 0.01 to 2% by mass, prior to the melting and sphering of the pulverized product of natural quartzite. The average sphericity of these particles was controlled by properly adjusting the flame temperature and the feed rate of the raw material.

All of the spherical amorphous silica powder samples A to were found to have a rate of amorphousness of not less than 99.5%. These powdery samples were subjected to the determination of the particle size distribution to thus obtain the maximum particle size and the content of particles having a particle size of not less than 20 μm and less than 40 μm. In addition, these powdery samples were likewise inspected for the amount of chemically adsorbed ammonia, the content of $Al_2O_3$ and the average sphericity of the particles having a particle size of not less than 45 μm. The maximum particle sizes (hereunder referred to as P1, P2 and P3, respectively) observed for the particles having particle sizes falling within the range of from 40 to 80 μm, 3 to 8 μm and 0.1 to 0.8 μm, respectively, were determined and the results thus obtained are summarized in Table 1 given below.

For the purpose of assessing the resulting spherical amorphous silica powder on the characteristic properties as the semiconductor-sealing material, there were added, to 90 parts (part by mass; those in the following description are shown in the same way also) each of the spherical amorphous silica powder samples A to J, there were added 4.2 parts of 4,4'-bis (2,3-epoxypropoxy)-3,3',5,5'-tetramethyl-bisphenyl type epoxy resin, 4.3 parts of a phenol resin, 0.2 part of triphenyl-phosphine, 0.5 part of γ-glycidoxy-propyl-trimethoxy-silane, 0.3 part of carbon black, and 0.5 part of carnauba wax, then the resulting mixture was dry-blended in a Henschel mixer and subsequently kneaded with heating in an intermeshing co-rotating twin screw extruder (screw diameter (D): 25 mm; kneading disk length: 10D mm; rotational number of paddle: 150 rpm; discharge rate: 5 kg/h; heater temperature: 105 to 110° C.). After cooling the kneaded product (discharged product) in a cooling press, the product was pulverized to thus give a semiconductor-sealing material and the latter was inspected for the moldability, flame retardancy and heat resistance according to the following methods. The results thus obtained are likewise summarized in the following Table 1.
(1) Moldability/Spiral Flow Test Each semiconductor-sealing material was evaluated for a spiral flow value using a transfer molding machine equipped with a mold for the spiral flow-determination according to EMMI-I-66 (Epoxy Molding Material Institute; Society of Plastic Industry). The transfer molding conditions used were as follows: Molding temperature: 175° C.; Molding pressure: 7.4 MPa; and Holding time: 90 sec.
(2) Flame Retardancy/UL-94

Each semiconductor-sealing material was subjected to transfer molding to form each corresponding specimen having a thickness of ⅛ inch, followed by the after-curing of the specimen at a temperature of 175° C. for 8 hours and the evaluation of the flame retardancy thereof according to the specification: UL-94.
(3) Heat Resistance/Ability to Withstand High Temperature Environmental Conditions After a TEG-ML1020 chip was mounted on SOP-28(made of Lead Frame 42 Alloy) and the lead frame and the chip were connected at 8 positions with gold wires each having a diameter φ30 μm, the resulting assembly was packaged with each semiconductor-sealing material to thus produce 20 each of the corresponding mimic or simulated semiconductors.

These 20 mimic semiconductors were subjected to after-curing operation at a temperature of 175° C. for 8 hours and they were allowed to stand in an environment maintained at 195° C. for 1500 hours, followed by cooling the same down to room temperature and the confirmation on whether they could pass an electric current therethrough or not to thus enumerate the number of mimic semiconductors in which even one out of the 8 wired positions was found to be failed in the continuity.

TABLE 1

|  | Ex. No. | | | | |
| --- | --- | --- | --- | --- | --- |
|  | 1 | 2 | 3 | 4 | 5 |
| Spherical amorphous silica powder sample No. | A | B | C | D | E |
| Maximum Particle Size   P1 (μm) | 48 | 48 | 55 | 55 | 64 |
| P2 (μm) | 5.6 | 7.6 | 3.5 | 4.5 | 4.5 |
| P3 (μm) | 0.5 | 0.5 | 0.6 | 0.9 | 0.4 |
| Rate (%) of particles having a particle size of not less than 20 μm and less than 40 μm | 6.4 | 13.9 | 7.4 | 15.6 | 14.3 |
| Amt. of chemically adsorbed ammonia (μmole/g) | 0.8 | 0.6 | 1.2 | 1.6 | 0.05 |
| $Al_2O_3$ content (ppm) | 1190 | 910 | 2600 | 5810 | 310 |
| Average sphericity of particles having a particle size of not less than 45 μm (—) | 0.92 | 0.91 | 0.89 | 0.90 | 0.90 |
| Moldability/Spiral Flow Value (cm) | 135 | 127 | 131 | 119 | 120 |
| Flame Retardancy/UL-94 | V-0 | V-0 | V-0 | V-0 | V-0 |
| Heat Resistance/Ability to Withstand High Temp. | 0/20 | 0/20 | 0/20 | 0/20 | 1/20 |

TABLE 1-continued

|  | Comp. Ex. No. | | | | |
| --- | --- | --- | --- | --- | --- |
|  | 1 | 2 | 3 | 4 | 5 |
| Spherical amorphous silica powder sample No. | F | G | H | I | J |
| Maximum Particle Size    P1 (μm) | 85 | 35 | 48 | 55 | 42 |
|                          P2 (μm) | 5.6 | 5.6 | 2.2 | 11 | 3.5 |
|                          P3 (μm) | 0.5 | 0.5 | 0.5 | 0.5 | 0.6 |
| Rate (%) of particles having a particle size of not less than 20 μm and less than 40 μm | 5.9 | 18.6 | 14.6 | 19.8 | 37.0 |
| Amt. of chemically adsorbed ammonia (μmole/g) | 1.6 | 1.8 | 0.1 | 1.1 | 0.2 |
| $Al_2O_3$ content (ppm) | 5660 | 6670 | 390 | 1560 | 560 |
| Average sphericity of particles having a particle size of not less than 45 μm (—) | 0.89 | 0.94 | 0.90 | 0.91 | 0.88 |
| Moldability/Spiral Flow Value (cm) | 80 | 72 | 106 | 103 | 86 |
| Flame Retardancy/UL-94 | V-0 | V-0 | V-0 | V-0 | V-1 |
| Heat Resistance/Ability to Withstand High Temp. | 1/20 | 0/20 | 2/20 | 0/20 | 3/20 |

As will be clear when comparing the results obtained in Examples with those obtained in Comparative Examples, the ceramic powder according to the present invention permits the preparation of a composition, in particular, a semiconductor-sealing material which is excellent in the moldability, the heat resistance and the flame retardancy as compared with the compositions obtained in Comparative Examples.

INDUSTRIAL APPLICABILITY

The ceramic powder according to the present invention can be applied to a semiconductor-sealing material used in, for instance, automobiles, portable telephones, personal computers and domestic appliances; multilayer plates on which semiconductors are mounted, and further fillers such as putty, sealing agents, various kinds of rubber materials, and various kinds of engineering plastics. In addition, the ceramic powder according to the present invention can likewise be used as, for instance, prepregs for use in, for instance, printed boards produced by impregnating glass woven fabrics, glass non-woven fabrics and other organic base materials with the ceramic powder of the invention as well as various kinds of engineering plastics, in addition to the foregoing semiconductor-sealing material.

What is claimed is:

1. A ceramic powder, comprising
   first particles having a maximum particle size of from 40 to 80 μm,
   second particles having a maximum particle size of from 3 to 8 μm,
   wherein
   an amount of particles having a particle size of from 20 to less than 40 μm is not more than 20% by mass, relative to the total mass of the ceramic powder,
   said ceramic powder has a chemical absorption amount of ammonia ranging from 0.1 to 1.8 μmole/g, and
   said ceramic powder has a multi-peak frequency distribution pattern having at least two peaks as a particle size distribution as determined using a laser diffraction-scattering type particle size-analyzer, the maximum particle size for the first peak ranging from 40 to 80 μm and that for the second peak ranging from 3 to 8 μm.

2. The ceramic powder as set forth in claim 1, further comprising third particles having a maximum particle size of from 0.1 to 0.8 μm.

3. The ceramic powder as set forth in claim 1, wherein the powder of said ceramic powder comprises a silica powder.

4. The ceramic powder as set forth in claim 3, further comprising $Al_2O_3$ content ranging in an amount of from 100 to 8000 ppm.

5. A composition comprising at least one of a resin and rubber and the ceramic powder as set forth in claim 1.

6. A semiconductor-sealing material comprising the composition as set forth in claim 5, wherein at least one of the resin and rubber is an epoxy resin.

7. The composition according to claim 5, wherein said ceramic powder is present in said composition in an amount of 10 to 99% by mass, relative to the total weight of the composition.

8. The composition according to claim 5, wherein said ceramic powder is present in said composition in an amount of 30 to 95% by mass, relative to the total weight of the composition.

9. The composition according to claim 5, comprising at least one resin selected from the group consisting of a phenol novolak epoxy resin; an o-cresol novolac epoxy resin; an epoxy resin obtained by epoxy-modifying a novolak resin of a phenol with an aldehyde; bisphenol A; bisphenol F; bisphenol S; a glycidyl ester acid epoxy resin prepared through reacting a polybasic acid with epichlorhydrin; a linear aliphatic epoxy resin; an alicyclic epoxy resin; a heterocyclic epoxy resin; an alkyl-modified polyfunctional epoxy resin; a β-naphthol novolac type epoxy resin; a 1,6-dihydroxynaphthalene epoxy resin; a 2,7-dihydroxynaphthalene epoxy resin; and a bishydroxy-biphenyl epoxy resin.

10. The ceramic powder as set forth in claim 1, wherein said first particles are present in an amount of at least 40% by mass, relative to the total mass of the ceramic powder, and said second particles are present in an amount of at least 20% by mass, relative to the total mass of the ceramic powder.

11. The ceramic powder as set forth in claim 1, wherein said first particles are present in an amount of from 40 to 70% by mass, relative to the total mass of the ceramic powder, and said second particles are present in an amount of from 20 to 60% by mass, relative to the total mass of the ceramic powder.

12. The ceramic powder as set forth in claim 1, wherein said first particles have a maximum particle size of from 48 to 80 μm.

13. The ceramic powder as set forth in claim 1, wherein said ceramic powder comprises a silica powder that comprises amorphous silica in an amount of at least 95% by mass, relative to the total amount of said silica powder.

14. The ceramic powder as set forth in claim 1, wherein said ceramic powder comprises at least one powder selected from the group consisting of silica powder, alumina powder, titania powder, magnesia powder, silicon nitride powder, aluminum nitride powder and boron nitride powder.

15. The ceramic powder as set forth in claim 1, which has an average degree of sphericity of from 0.85 to 1.00.

16. The ceramic powder as set forth in claim 1, which has an average degree of sphericity of from 0.90 to 1.00.

17. The ceramic powder as set forth in claim 1, wherein an amount of particles having a particle size of from 20 to less than 40 μm is from 6.4 to 20% by mass, relative to the total mass of the ceramic powder.

18. The ceramic powder as set forth in claim 1, wherein said ceramic powder has a chemical absorption amount of ammonia ranging from 0.1 to 1.6 μmole/g.

19. The ceramic powder as set forth in claim 1, wherein said ceramic powder has a chemical absorption amount of ammonia ranging from 0.2 to 1.4 μmole/g.

20. A ceramic powder, comprising
  silica powder, comprising
    silica particles having a maximum particle size of from 48 to 64 μm,
    silica particles having a maximum particle size of from 3.5 to 7.6 μm,
    silica particles having a maximum particle size of from 0.4 to 0.9 μm, and
  $Al_2O_3$ particles present in said ceramic powder in an amount of from 310 to 5810 ppm, wherein
  said silica powder comprises amorphous silica in an amount of at least 95% by mass, relative to the total amount of said silica powder,
  an amount of particles having a particle size of from 20 to less than 40 μm is from 6.4 to 15.6% by mass, relative to the total mass of the ceramic powder, and
  said ceramic powder has a multi-peak frequency distribution pattern having at least two peaks as a particle size distribution as determined using a laser diffraction-scattering type particle size-analyzer, the maximum particle size for the first peak ranging from 40 to 80 μm and that for the second peak ranging from 3 to 8 μm.

* * * * *